(12) United States Patent
Yuan et al.

(10) Patent No.: US 10,615,218 B2
(45) Date of Patent: Apr. 7, 2020

(54) X-RAY DETECTOR

(71) Applicant: General Electric Company, Schenectady, NY (US)

(72) Inventors: Dayang Yuan, Beijing (CN); Hongye Zhang, Beijing (CN)

(73) Assignee: General Electric Company, Schenectady, NY (US)

( * ) Notice: Subject to any disclaimer, the term of this patent is extended or adjusted under 35 U.S.C. 154(b) by 108 days.

(21) Appl. No.: 15/298,611

(22) Filed: Oct. 20, 2016

(65) Prior Publication Data
US 2017/0125477 A1 May 4, 2017

(30) Foreign Application Priority Data
Oct. 30, 2015 (CN) .......................... 2015 1 0728002

(51) Int. Cl.
*H01L 27/146* (2006.01)
*G01T 1/20* (2006.01)

(52) U.S. Cl.
CPC ...... *H01L 27/14663* (2013.01); *G01T 1/2006* (2013.01); *H01L 27/14689* (2013.01)

(58) Field of Classification Search
CPC ......... H01L 27/14663; H01L 27/14689; G01T 1/2006
See application file for complete search history.

(56) References Cited

U.S. PATENT DOCUMENTS

| | | | | |
|---|---|---|---|---|
| 5,144,141 A | * | 9/1992 | Rougeot | G01T 1/2018 250/366 |
| 6,177,237 B1 | | 1/2001 | Guida et al. | |
| 2008/0245968 A1 | * | 10/2008 | Tredwell | G01T 1/2018 250/370.09 |
| 2010/0294940 A1 | * | 11/2010 | Wieczorek | G01T 1/2018 250/363.03 |
| 2012/0321041 A1 | * | 12/2012 | Ikhlef | G21K 1/025 378/62 |
| 2013/0322603 A1 | * | 12/2013 | Kurochi | G21K 1/025 378/147 |
| 2015/0146842 A1 | * | 5/2015 | Kurochi | G21F 1/00 378/4 |
| 2017/0265822 A1 | * | 9/2017 | Du | A61B 6/03 |

* cited by examiner

*Primary Examiner* — Michael Jung

(57) ABSTRACT

The present invention provides an X-ray detector and a manufacturing method thereof, the manufacturing method comprising: forming an X-ray to visible light converting layer, under which a photoelectric converting layer and a signal processing layer are provided in sequence; providing a soft insulating material on the X-ray to visible light converting layer to form a protective layer; and forming a bendable grid layer on the protective layer.

14 Claims, 1 Drawing Sheet

X-RAY DETECTOR

FIELD

The present invention relates to the field of medical imaging, particularly to X-ray detector and a method for manufacturing the same.

BACKGROUND

In the field of medical diagnosis, an X-ray detector may be used for detecting an X-ray passing through an object being detected and for finally outputting a digital signal indicative of attenuation degree of the X-ray for image reconstruction. Currently, in order to improve the image quality, special grid means usually needs to be equipped. When using, the x-ray detector firstly needs to be installed into grids so that X-ray detection may be performed, which results in a relatively complicated operation. Moreover, the grid means cannot be bent, so that the X-ray detector needs to be bent to perform the X-ray detection, causing a conflict, which limits an application range of the X-ray detector.

SUMMARY

One objective of the present invention is to provide an X-ray detector that is conveniently used and has a wide application range, and to provide a method for manufacturing the same.

An exemplary embodiment of the present invention provides a method for manufacturing an X-ray detector, comprising: forming an X-ray to visible light converting layer, under which a photoelectric converting layer and a signal processing layer are provided in sequence; providing a soft insulating material on the X-ray to visible light converting layer to form a protective layer; and forming a bendable grid layering the protective layer.

An exemplary embodiment of the present invention also provides an X-ray detector manufactured by the above method for manufacturing an X-ray detector.

Other features and aspects will become apparent from the following Detailed Description, the Drawings and the Claims.

BRIEF DESCRIPTION OF THE DRAWINGS

The present invention can be understood better in light of the description of exemplary embodiments of the present invention with reference to the accompanying drawings, in which.

DETAILED DESCRIPTION

Hereafter, a detailed description will be given for preferred embodiments of the present disclosure. It should be pointed out that in the Detailed Description of the embodiments, for simplicity and conciseness, it is impossible for the detailed description to describe all the features of the practical embodiments in details. It should be understood that in the process of a practical implementation of any embodiment, just as in the process of an engineering project or a designing project, in order to achieve a specific goal of the developer and in order to satisfy some system-related or business-related constraints, a variety of decisions will usually be made, which will also be varied from one embodiment to another. In addition, it can also be understood that although the effort made in such developing process may be complex and time-consuming, some variations such as design, manufacture and production on the basis of the technical contents disclosed in the disclosure are just customary technical means in the art for those of ordinary skilled in the art associated with the contents disclosed in the present disclosure, which should not be regarded as insufficient disclosure of the present disclosure.

Unless defined otherwise, all the technical or scientific terms used in the Claims and the Description should have the same meanings as commonly understood by one of ordinary skilled in the art to which the present disclosure belongs. The terms "first", "second" and the like in the Description and the Claims of the present utility model do not mean any sequential order, number or importance, but are only used for distinguishing different components. The terms "a", "an" and the like do not denote a limitation of quantity, but denote the existence of at least one. The terms "comprises", "comprising", "includes", "including" and the like mean that the element or object in front of the "comprises", "comprising", "includes" and "including" covers the elements or objects and their equivalents illustrated following the "comprises", "comprising", "includes" and "including", but do not exclude other elements or objects. The term "coupled" or "connected" or the like is not limited to being connected physically or mechanically, nor limited to being connected directly or indirectly.

Figure 1:
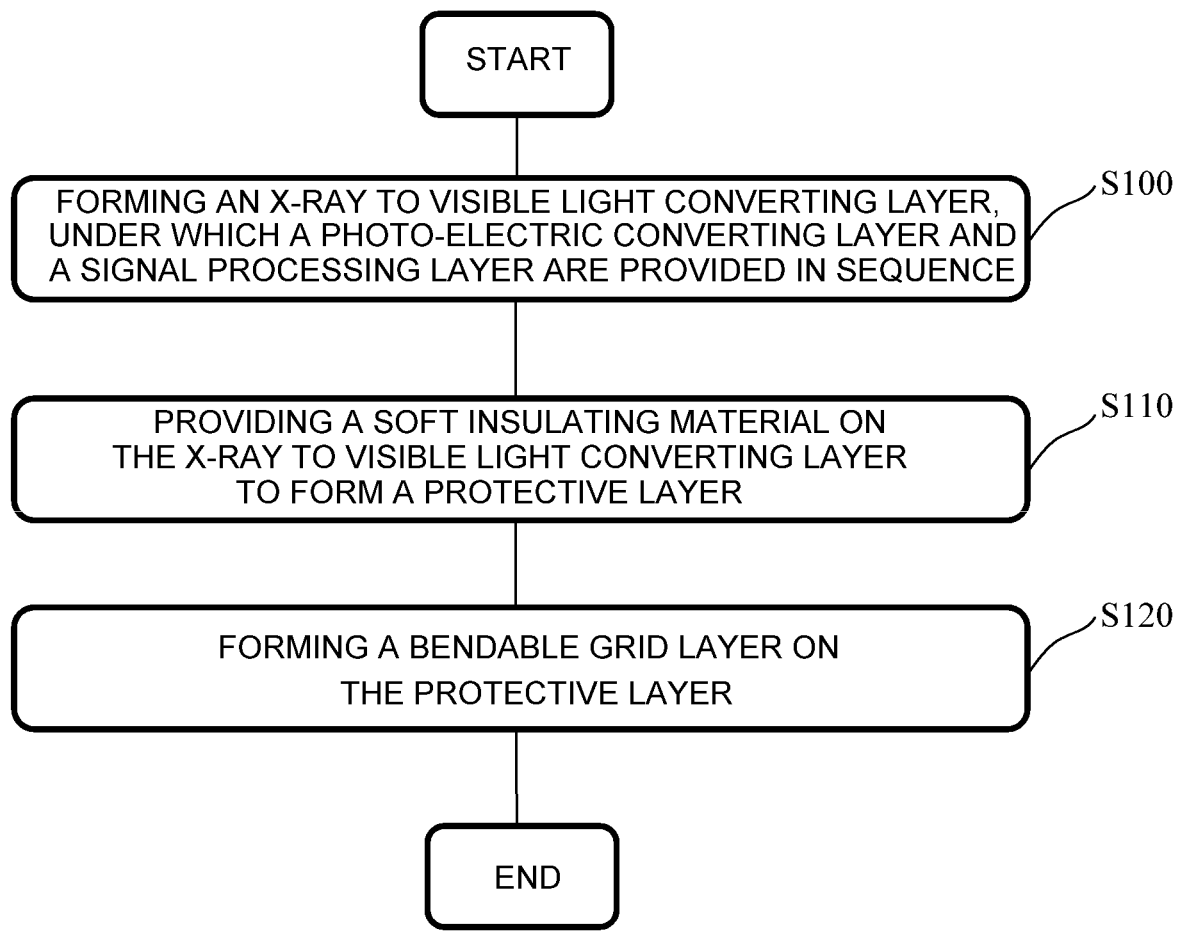
FIG. 1 is a flowchart of a method for manufacturing an X-ray detector provided for one embodiment of the present invention.
Figure 2:
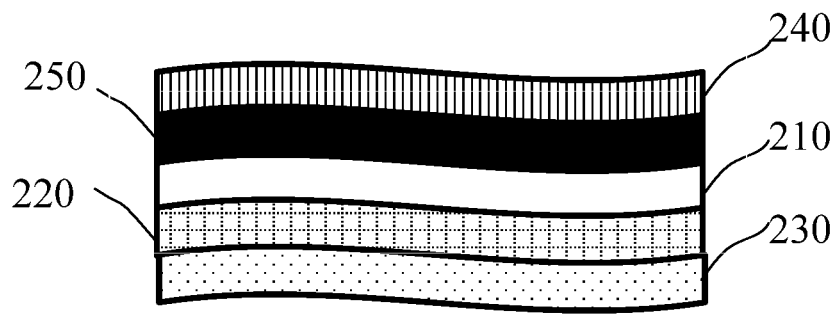
FIG. 2 is a structure schematic diagram of an X-ray detector provided for one embodiment of the present invention.

FIG. 1 is a flowchart of a method for manufacturing an X-ray detector provided for one embodiment of the present invention; FIG. 2 is a structure schematic diagram of an X-ray detector provided for one embodiment of the present invention. As shown in FIG. 1 and FIG. 2, the above method for manufacturing an X-ray detector includes the following Step S100, Step S110, and Step S120.

Step S100: forming an X-ray to visible light converting layer 210, under which a photoelectric converting layer 220 and a signal processing layer 230 are provided in sequence. The X-ray to visible light converting layer 210 is used for converting an X-ray incident to the X-ray detector into a visible light, and may include, for example, a scintillator. The photoelectric converting layer 220 is used for converting the converted visible light into a digital signal, and may include, for example, a plurality of photodiodes provided in parallel. The signal processing layer 230 is used for processing the digital signal, e.g., transmitting the digital signal. The signal processing layer 230 may be, for example, a soft printed circuit. Those skilled in the art should understand that both the photoelectric converting layer 220 and the signal processing layer 230 provided in sequence under the above X-ray to visible light converting layer 210 may be formed of a soft material to be bendable. Moreover, according to the common knowledge in the art, other functional layers, e.g., a protective layer, an X-ray absorbing layer, etc. may also be provided between every two layers of the X-ray to visible light converting layer 210, the photoelectric converting layer 220 and the signal processing layer 230 described above, which is not repetitively described.

Step S110: providing a soft insulating material on the X-ray to visible light converting layer 210 to form a protective layer 250. Optionally, the soft insulating material includes, but is not limited to, carbon fiber. In this step, the soft insulating material may be formed on the X-ray to visible light converting layer 210 by the way of, for example, adhesion.

Step S120: forming a bendable grid layer 240 on the protective layer 250.

As one implementation, Step S120 may include the following steps: providing one layer of an X-ray absorbing film on the protective layer 250, the X-ray absorbing film containing a tungsten material or a lead material; and etching on the X-ray absorbing film to form grids.

The X-ray absorbing film may be provided on the protective layer 250 by the way of, for example, adhesion. In Step S120, the X-ray absorbing film can be bent by choosing the tungsten or lead material with smaller rigidity and configuring the content thereof appropriately, and in turn the formed grids may also be bent.

As another implementation, Step S120 may include the following steps: performing 3D printing on the protective layer 250 to form the grids; or providing the grids being formed by the 3D printing on the protective layer. Optionally, when the 3D printing is performed to form the grids, the material used includes, but is not limited to, barium sulfate.

In an embodiment of the present invention, a width of the grids of the grid layer may be limited within a specific value to enable individual grids to be aligned with individual pixel points of the X-ray detector more precisely to reduce an alignment error. For example, the grids with a width less than the specific width may be formed directly by etching or 3-D printing, or may also be implemented by the following method: after Step S130, slicing the grids of the grid layer 240 so that the width of the grids of the grid layer is less than the specific value that is, for example, 200 micrometers.

Moreover, in an embodiment of the present invention, a height of the grid layer 240 may be limited within 1 millimeter when it is formed to enable the grid layer to bend and have a higher reliability.

In order to prevent Moire artifacts due to bend of the detector, the grid layer 240 is constructed to be capable of bending at a specific part in Step S130. For example, the soft material may be only employed at the specific part, or a securing structure or the like is provided at other part except the specific part. Those skilled in the art should understand that one part may be selected as the specific part according to quality of the corresponding image part. For example, the specific part may be a middle, four sides or other part of the grid layer. In this way, it may facilitate the corresponding correction of artifacts performed subsequently so as to improve the image quality.

As shown in FIG. 2, one embodiment of the present invention also provides an X-ray detector manufactured by the above method for manufacturing an X-ray detector.

The X-ray detector includes the X-ray to visible light converting layer 210, and the photoelectric converting layer 220 and the signal processing layer 230 provided under the X-ray to visible light converting layer 210 in sequence described above. The X-ray detector further includes the protective layer 250 formed on the X-ray to visible light converting layer 210 and the grid layer 240 formed on the protective layer 250, and the grid layer 420 can be bent.

Alternatively, a material of the protective layer 250 is a soft insulating material, e.g., carbon fiber.

Optionally, the grid layer 240 includes a tungsten material, a lead material, or barium sulfate.

Alternatively, a height of the grid layer 240 is not greater than 1 millimeter.

Alternatively, a width of every grid on the grid layer 240 is not greater than 200 micrometers.

For the "grid layer" described in the present invention, the grids may have a lattice shape, and may also have a striped shape or other shapes with an effect of filtering the X-ray, and the present invention does not limit the shape of the grids.

In the above embodiments of the present invention, the grids are integrated on the X-ray detector directly by forming the bendable grid layer on the X-ray to visible light converting layer 210. When using, the detector needs not to be installed within the grid means while they are provided in an X-ray medical diagnosis system, so that the X-ray detector is used more conveniently. Moreover, since the bendable grid layer has been designed and integrated to the detector, not only the image problem due to scattering of the X-ray can be avoided so as to improve the image quality, but also more using conditions can be satisfied as compared with traditional grid of fixed morphology so that a using range of the X-ray detector is greater.

In the above, some exemplary embodiments have been described. However, it should be understood that various modifications may be made thereto. For example, if the described technology performs in a different sequence and/or if components in the described system, architecture, device or circuit are combined in a different way and/or replaced or supplemented by other components or their equivalence, a suitable result may be achieved. Accordingly, other implementation also falls within a protection range of the Claims.

What is claimed is:

1. An X-ray detector, comprising:
    an X-ray to visible light converting layer, under which a photoelectric converting layer and a signal processing layer are provided in a sequence;
    an insulating material layer formed on the X-ray to visible light converting layer which forms a protective layer, wherein the insulating material comprises carbon fiber;
    a grid layer formed on the protective layer;
    wherein the grid layer comprises a layer of an X-ray absorbing film having an etched structure; and
    wherein the insulating material layer is directly disposed on the X-ray to visible light converting layer.

2. The X-ray detector according to claim 1, wherein the X-ray absorbing film comprises a tungsten material or a lead material.

3. The X-ray detector according to claim 1, wherein the grid layer is formed by:
    3D printing material on the protective layer; and
    grids formed in the 3D printing material on the protective layer.

4. The X-ray detector according to claim 3, wherein the 3D printing material is barium sulfate.

5. The X-ray detector according to claim 4, wherein the grids formed in the 3D printing material have a width less than a specific value.

6. The X-ray detector according to claim 1, wherein the grid layer is bendable.

7. The X-ray detector according to claim 1, wherein a height of the grid layer is not greater than 1 millimeter.

8. The X-ray detector according to claim 1, wherein a width of a grid on the grid layer is not greater than 200 micrometers.

9. The X-ray detector according to claim 1, wherein the X-ray to visible light converting layer, the insulating material layer, and the grid layer are all bendable.

10. The X-ray detector according to claim 1, wherein a grid on the grid layer has a lattice shape.

11. The X-ray detector according to claim 1, wherein the insulating material layer and the grid layer X-ray are provided above the visible light converting layer in a sequence.

12. The X-ray detector according to claim 1, wherein the photoelectric converting layer is directly disposed on the signal processing layer are provided.

13. The X-ray detector according to claim 1, wherein grid on the grid layer has a striped shape.

14. An X-ray detector, comprising:
an X-ray to visible light converting layer, under which a photoelectric converting layer and a signal processing layer are provided in sequence;
an insulating material layer formed on the X-ray to visible light converting layer which forms a protective layer, wherein the insulating material comprises carbon fiber;
a grid layer formed on the protective layer;
wherein the grid layer comprises a layer of an X-ray absorbing film having an etched structure;
wherein a height of the grid layer is not greater than 1 millimeter; and
wherein the photoelectric converting layer is directly disposed on the signal processing layer are provided.

* * * * *